United States Patent
Takenaka (10) Patent No.: US 8,902,394 B2
(45) Date of Patent: Dec. 2, 2014

(54) DISPLAY DEVICE COMPRISING A FLEXIBLE BOARD INCLUDING A FIRST WIRING PORTION THAT IS NARROWER THAN A SECOND WIRING PORTION AND WHEREIN THE SECOND WIRING PORTION DOES NOT OVERLAP A TERMINAL PORTION

(75) Inventor: Yuuichi Takenaka, Chiba (JP)

(73) Assignees: Japan Display Inc., Tokyo (JP); Panasonic Liquid Crystal Display Co., Ltd., Hyogo-ken (JP)

( * ) Notice: Subject to any disclaimer, the term of this patent is extended or adjusted under 35 U.S.C. 154(b) by 586 days.

(21) Appl. No.: 13/115,131

(22) Filed: May 25, 2011

(65) Prior Publication Data

US 2011/0292313 A1    Dec. 1, 2011

(30) Foreign Application Priority Data

May 28, 2010   (JP) .................................. 2010-123023

(51) Int. Cl.
- *G02F 1/1345* (2006.01)
- *H05K 1/18* (2006.01)
- *H05K 3/36* (2006.01)
- *H05K 3/40* (2006.01)

(52) U.S. Cl.
CPC ............ *G02F 1/13452* (2013.01); *H05K 3/363* (2013.01); *H05K 2201/10136* (2013.01); *H05K 3/403* (2013.01); *H05K 3/4092* (2013.01); *H05K 1/189* (2013.01)
USPC .......................... 349/150; 349/151; 349/152

(58) Field of Classification Search
CPC .................................................... G02F 1/13458
USPC ................................................... 349/149–152
See application file for complete search history.

(56) References Cited

U.S. PATENT DOCUMENTS

| | | | |
|---|---|---|---|
| 6,300,997 B1 * | 10/2001 | Saito et al. ..................... | 349/149 |
| 6,495,768 B1 * | 12/2002 | Cho .............................. | 174/250 |
| 2005/0285833 A1 * | 12/2005 | Yarita et al. ..................... | 345/87 |
| 2006/0267971 A1 * | 11/2006 | Yoo ................................ | 345/206 |
| 2009/0033609 A1 | 2/2009 | Ashizawa et al. | |
| 2009/0153791 A1 * | 6/2009 | Chang et al. .................. | 349/151 |
| 2011/0102729 A1 * | 5/2011 | Kawamura et al. ........... | 349/158 |

FOREIGN PATENT DOCUMENTS

| | | | |
|---|---|---|---|
| JP | 2009-036871 | 2/2009 | |
| WO | WO 2010/004875 A1 | 1/2010 | |
| WO | WO 2010004875 A1 * | 1/2010 | ............... H05K 3/00 |

* cited by examiner

*Primary Examiner* — Paul Lee (74) *Attorney, Agent, or Firm* — Antonelli, Terry, Stout & Kraus, LLP.

(57) ABSTRACT

Provided is a display device, including: a display panel which includes a thin film transistor substrate (SUB1) on which a terminal portion including a plurality of terminals (TR) is provided; and a drive circuit connected to the terminal portion, in which: the drive circuit includes: a flexible board (FB); and a semiconductor chip mounted on the flexible board; the flexible board (FB) includes a plurality of wirings (La) for connecting the semiconductor chip and the plurality of terminals (TR), respectively; and the plurality of wirings (La) each include: a first wiring portion (La1) which overlaps a corresponding one of the plurality of terminals (TR); and a second wiring portion (La2) which is positioned between the first wiring portion (La1) and the semiconductor chip, the first wiring portion (La1) being narrower than the second wiring portion (La2).

8 Claims, 7 Drawing Sheets

DISPLAY DEVICE COMPRISING A FLEXIBLE BOARD INCLUDING A FIRST WIRING PORTION THAT IS NARROWER THAN A SECOND WIRING PORTION AND WHEREIN THE SECOND WIRING PORTION DOES NOT OVERLAP A TERMINAL PORTION

CROSS-REFERENCE TO RELATED APPLICATION

The present application claims priority from Japanese application JP 2010-123023 filed on May 28, 2010, the content of which is hereby incorporated by reference into this application.

BACKGROUND OF THE INVENTION

1. Field of the Invention

The present invention relates to a display device.

2. Description of the Related Art

Display devices, including liquid crystal display devices and organic EL display devices, are widely used as display devices for information communication terminals, such as computers, and television sets. For example, the liquid crystal display device is a device using a liquid crystal display panel. The liquid crystal display panel displays an image by changing an electric field to change the alignment of a liquid crystal composition which is sealed between a thin film transistor (TFT) substrate and a counter substrate, thereby controlling the transmittance of light that passes through the two substrates and the liquid crystal composition. The electric field is changed for each of a plurality of pixels formed in the liquid crystal display panel.

In order to change the electric field for each pixel, the thin film transistor substrate of the liquid crystal display panel has a plurality of video signal lines and a plurality of scanning signal lines formed therein, and the video signal line and the scanning signal line are connected to a thin film transistor disposed in each pixel.

Then, to the video signal line, a video signal corresponding to a gray level of each pixel is output from a drain driver which is installed outside a display region of the liquid crystal display panel. To the scanning signal line, a signal (gate signal) indicative of a timing for inputting the video signal to each pixel is output from a gate driver which is installed outside the display region. The video signal supplied to each pixel is applied to a pixel electrode via the thin film transistor.

The above-mentioned drain driver and gate driver (herein, also referred to as drive circuits) are formed as, for example, a film package mounting a semiconductor chip, typified by chip on film (COF), and are connected to the thin film transistor substrate on which the video signal lines and the scanning signal lines are formed.

The thin film transistor substrate includes a terminal portion for making connection between the above-mentioned video signal lines or scanning signal lines and the above-mentioned COF. An example of this structure is disclosed in Japanese Patent Application Laid-open No. 2009-36871.

SUMMARY OF THE INVENTION

As a result of the recent technical approach for reducing initial cost, the finer processing technology is used for the semiconductor chip to be mounted on the COF, and the improvement of technology of forming wiring on the flexible board FB is being advanced.

As the wiring on the flexible board becomes finer, it becomes more difficult to prevent an electrical failure in a connection portion between the display panel and the flexible board while ensuring the mechanical strength of the wiring on the flexible board.

The present invention has been made in view of the above-mentioned problem, and therefore has an object to provide a display device capable of both preventing a failure in a connection portion between the terminal portion of the thin film transistor substrate and the wiring of the flexible board and ensuring the mechanical strength of the wiring on the flexible board.

In view of the above-mentioned problem, a display device according to the present invention includes: a display panel which includes a thin film transistor substrate on which a terminal portion including a plurality of terminals is provided; and a drive circuit connected to the terminal portion, in which: the drive circuit includes: a flexible board; and a semiconductor chip mounted on the flexible board; the flexible board includes a plurality of wirings for connecting the semiconductor chip and the plurality of terminals, respectively; and the plurality of wirings each include: a first wiring portion which overlaps a corresponding one of the plurality of terminals; and a second wiring portion which is positioned between the first wiring portion and the semiconductor chip, the first wiring portion being narrower than the second wiring portion.

Further, in one aspect of the display device according to the present invention, the plurality of terminals may be disposed at a distance from an edge portion of the thin film transistor substrate on an inner side of the thin film transistor substrate.

Further, in one aspect of the display device according to the present invention: a part of the flexible board may overlap a part of the thin film transistor substrate including the terminal portion; the plurality of wirings may each further include a third wiring portion which is positioned between the first wiring portion and the second wiring portion; and the third wiring portion may overlap a region between the edge portion of the thin film transistor substrate and the corresponding one of the plurality of terminals, and may be gradually increased in line width as being closer to the second wiring portion.

Further, in one aspect of the display device according to the present invention, the second wiring portion may overlap the edge portion of the thin film transistor substrate.

Further, in one aspect of the display device according to the present invention: the plurality of terminals may be arranged with a predetermined pitch; the plurality of wirings may each be formed into a rectangular cross section; and the first wiring portion may have a line width which is 0.3 times or more and 0.4 times or less of the predetermined pitch.

Further, in one aspect of the display device according to the present invention: the plurality of terminals may be arranged along the edge portion of the thin film transistor substrate with a predetermined pitch; and the plurality of wirings may each intersect substantially perpendicularly with the edge portion of the thin film transistor substrate, and overlap the plurality of terminals, respectively.

The present invention can provide the display device capable of both preventing a failure in the connection portion between the terminal portion of the thin film transistor substrate and the wiring of the flexible board and ensuring the mechanical strength of the wiring on the flexible board.

DETAILED DESCRIPTION OF THE INVENTION

Hereinafter, an embodiment of the present invention is described with reference to the drawings.

First Embodiment

Figures 1A, 1B:
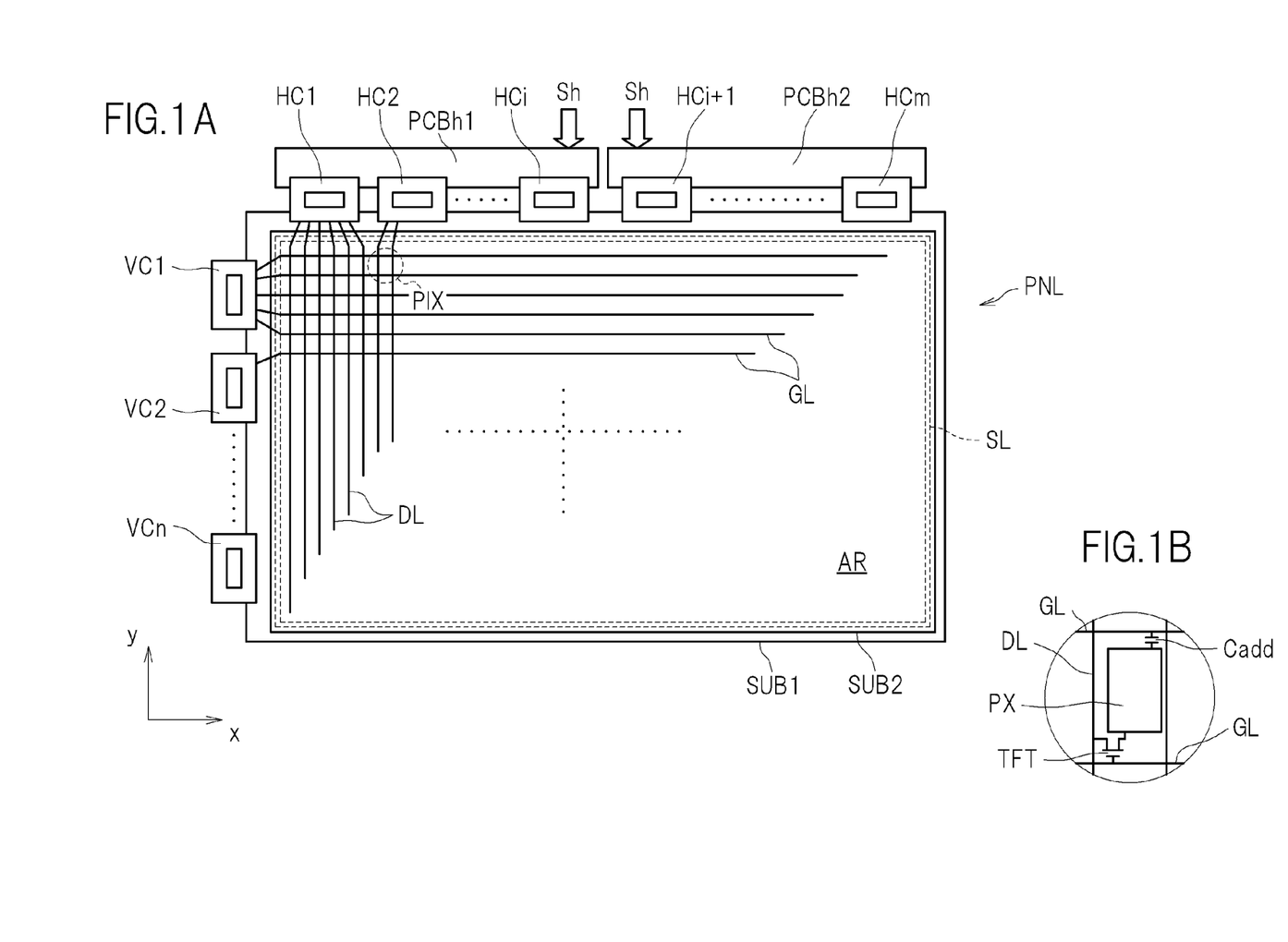
FIG. 1A is a view illustrating a schematic structure of a liquid crystal display device according to a first embodiment of the present invention.
FIG. 1B is an equivalent circuit diagram of each pixel region of FIG. 1A.

FIG. 1A is a schematic plan view of a display device according to a first embodiment of the present invention. FIG. 1B is an equivalent circuit diagram of each pixel region of FIG. 1A. The display device according to this embodiment is a liquid crystal display device, and a liquid crystal display panel PNL includes a thin film transistor substrate SUB1 and a counter substrate SUB2 which are disposed so as to be opposed to each other while sandwiching liquid crystal (not shown).

Further, the liquid crystal is sealed by a sealing material SL, which also serves to fix the counter substrate SUB2 onto the thin film transistor substrate SUB1. A region surrounded by the sealing material SL forms a display region AR for displaying an image.

In the display region AR, on the thin film transistor substrate SUB1 side, there are formed a plurality of gate signal lines GL extending in the x direction of FIG. 1A and being arranged in parallel to each other in the y direction and a plurality of drain signal lines DL extending in the y direction of FIG. 1A and being arranged in parallel to each other in the x direction.

In the display region AR, regions (pixel regions PIX) each surrounded by adjacent two of the gate signal lines GL and adjacent two of the drain signal lines DL are arranged in matrix. An equivalent circuit of the pixel region PIX includes, as illustrated in FIG. 1B for example, a thin film transistor TFT, a pixel electrode PX, and a capacitive element Cadd. In the pixel region PIX, a scanning signal from the gate signal line GL is input to the thin film transistor TFT, and a video signal from the drain signal line DL is supplied to the pixel electrode PX via the thin film transistor TFT. The capacitive element Cadd is connected between the pixel electrode PX and the gate signal line GL which outputs a gate signal to an adjacent pixel region. The capacitive element Cadd is provided for storing electric charges for a relatively long time when the video signal is supplied to the pixel electrode PX. Further, on a surface of the counter substrate SUB2 on the liquid crystal side, a counter electrode (not shown) is provided in common to the respective pixel regions. By applying an electric field between the counter electrode and the pixel electrode PX, the liquid crystal is driven.

The gate signal lines GL extend beyond the sealing material SL, for example, at one end on the left side of FIG. 1A, and are connected to a plurality of gate drivers VC1, VC2, . . . , VCn disposed at the periphery of the left side of the thin film transistor substrate SUB1. With the driving of the gate drivers VC1, VC2, . . . , VCn, the scanning signals are sequentially supplied to the respective gate signal lines GL.

Further, the drain signal lines DL extend beyond the sealing material SL, for example, at one end on the upper side of FIG. 1A, and are connected to a plurality of drain drivers HC1, HC2, . . . , HCm disposed at the periphery of the upper side of the thin film transistor substrate SUB1. With the driving of the drain drivers HC1, HC2, . . . , HCm, the video signals are supplied to the respective drain signal lines DL. In this case, the video signals are supplied in synchronization with timing of supplying the scanning signals to the respective gate signal lines GL by the gate drivers VC1, VC2, . . . , VCn.

Each of the gate drivers VC1, VC2, . . . , VCn is constituted by a drive circuit which is formed by a so-called chip on film (COF) method, in which a driver chip is mounted on a flexible board to be described later.

Further, similarly to the gate drivers VC1, VC2, . . . , VCn, each of the drain drivers HC1, HC2, . . . , HCm is also constituted by a drive circuit which is formed by the COF method, and is disposed to straddle the liquid crystal display panel PNL and a printed circuit board PCBh1 or PCBh2, which is disposed close to the liquid crystal display panel PNL.

Further, the printed circuit boards PCBh1 and PCBh2 are supplied with a signal Sh from a control circuit (T-con) (not shown). The signal Sh is input to the drain drivers HC1, HC2, . . . , HCm via the printed circuit boards PCBh1 and PCBh2.

The liquid crystal display panel PNL as described above is fixed by a frame together with, for example, a backlight, thereby forming a module.

Figure 2A:
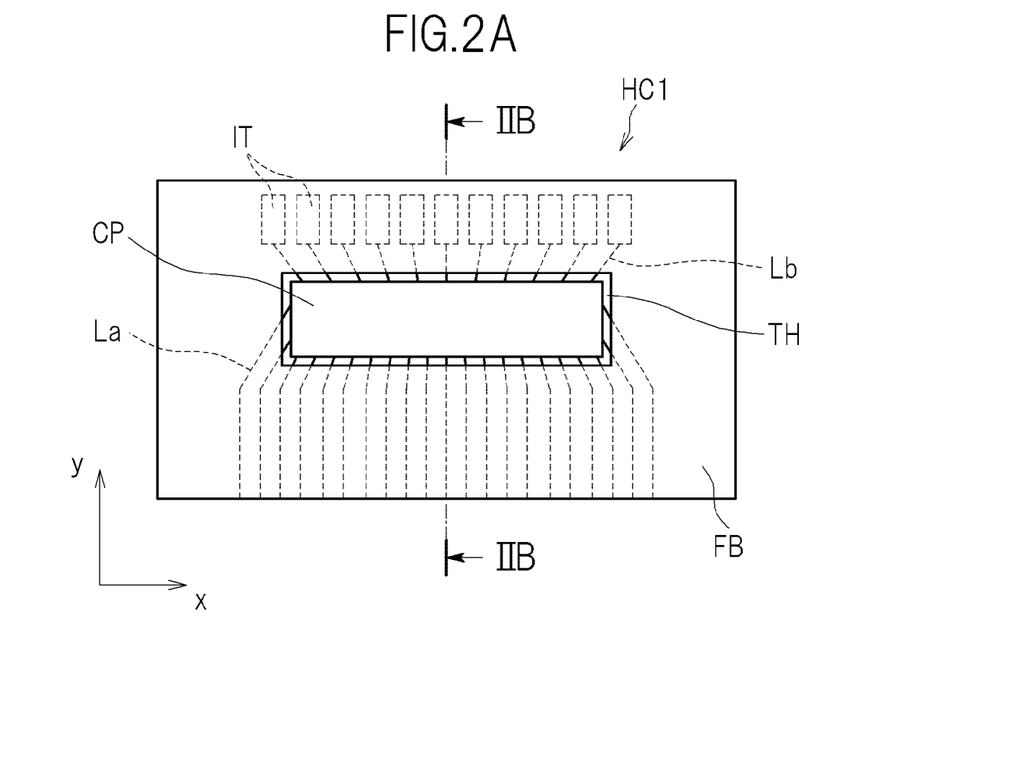
FIG. 2A is a view illustrating a schematic structure of a drive circuit according to the first embodiment.
Figure 2B:
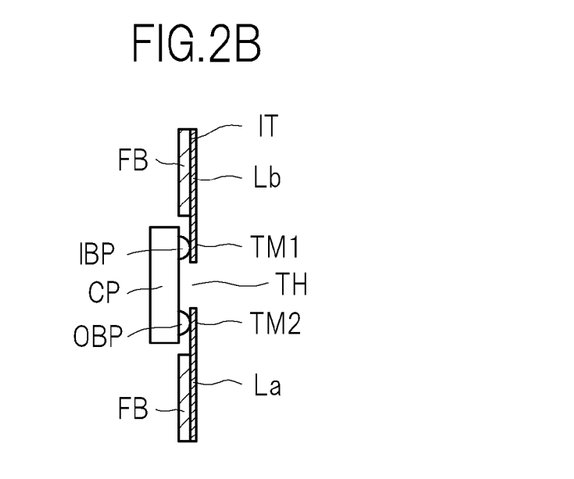
FIG. 2B is a view illustrating the IIB-IIB cross section of FIG. 2A.

Next, the drive circuit is described. FIGS. 2A and 2B are views illustrating a schematic structure of the drive circuit according to this embodiment, illustrating the drain driver HC1 of FIG. 1A as an example thereof.

As described above, the drive circuit is formed by the COF method, and a semiconductor chip CP serving as a driver IC is mounted substantially at the center of a flexible board FB made of a resin material. In the flexible board FB, there are formed a plurality of wirings La for connecting the thin film transistor substrate SUB1 and the semiconductor chip CP, input terminals IT for connecting the flexible board FB and the printed circuit board PCBh1, and a plurality of wirings Lb for connecting the input terminals IT and the semiconductor chip CP.

FIG. 2B is a view illustrating a schematic cross section taken along the line IIB-IIB of FIG. 2A. As illustrated in FIG. 2B, the input terminal IT and the wirings La and Lb are each formed on a surface of the flexible board FB opposite to the side on which, for example, the semiconductor chip CP is mounted.

In a region of the flexible board FB where the semiconductor chip CP is mounted, a through-hole TH is formed. Further, the leading ends of the wirings Lb connected to the respective input terminals IT are formed so as to protrude into the through-hole TH. Those protruding portions constitute terminals TM1 which are connected to respective input bumps IBP of the semiconductor chip CP. Further, the leading ends of the wirings La are also formed so as to protrude into the through-hole TH. Those protruding portions constitute terminals TM2 which are connected to respective output bumps OBP of the semiconductor chip CP.

The semiconductor chip CP is mounted on a surface of the flexible board FB opposite to the surface on which the input terminals IT, the wirings La, and the wirings Lb are formed. The input bumps IBP and the output bumps OBP of the semiconductor chip CP are connected via solder or the like to the terminals TM1 of the wirings Lb and the terminals TM2 of the wirings La, respectively.

Note that, on the surface of the flexible board FB on which the semiconductor chip CP is mounted, a resin material (solder resist film) is applied to cover the semiconductor chip CP. However, in FIGS. 2A and 2B, the resin material is not illustrated.

Figure 3A:
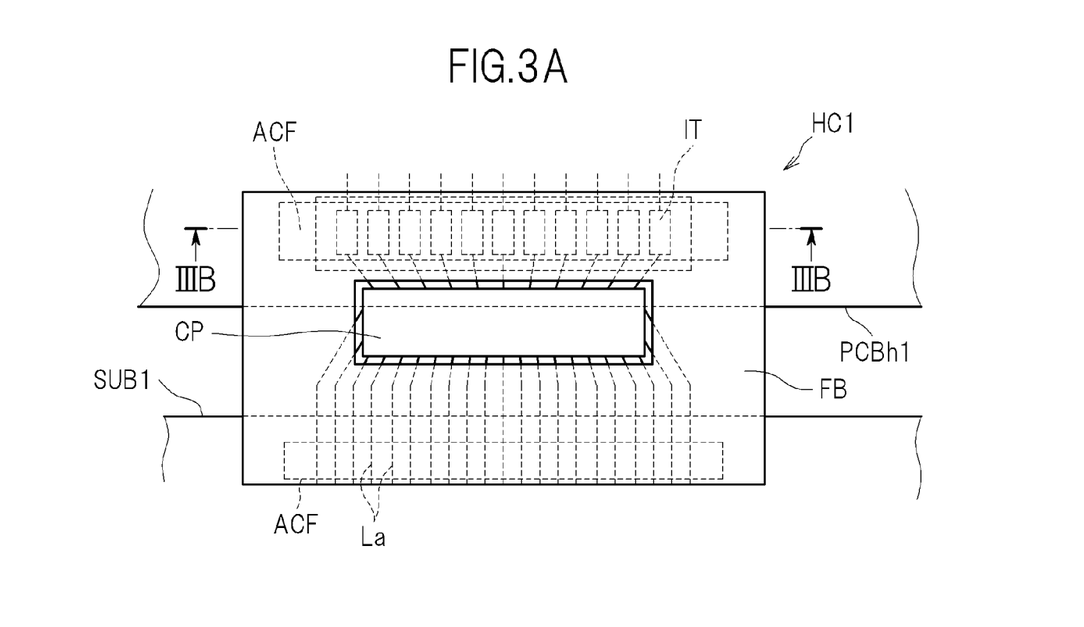
FIG. 3A is a view schematically illustrating a state in which the drive circuit according to the first embodiment is connected to a printed circuit board and a thin film transistor substrate.
Figure 3B:
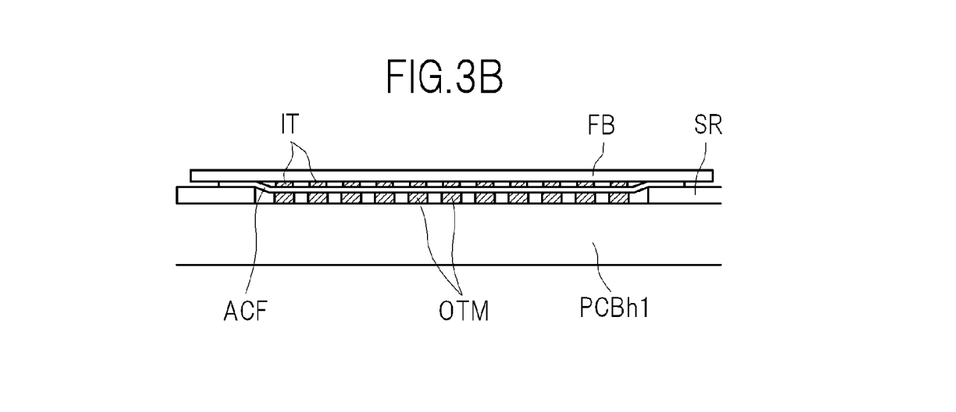
FIG. 3B is a view illustrating the IIIB-IIIB cross section of FIG. 3A.

Further, FIGS. 3A and 3B are views schematically illustrating a state in which the flexible board FB of the drive circuit is connected to the printed circuit board PCBh1 and the thin film transistor substrate SUB1. FIG. 3A is a top view and FIG. 3B is a cross-sectional view taken along the line IIIB-IIIB of FIG. 3A. The printed circuit board PCBh1, an anisotropic conductive film ACF, and the flexible board FB are arranged and laminated in the stated order so that the input terminals IT of the flexible board FB and output terminals OTM of the printed circuit board PCBh1 may be opposed to one another. Substantially the same laminated arrangement is provided on the liquid crystal display panel PNL side, in which the anisotropic conductive film ACF is interposed between the flexible board FB and the thin film transistor substrate SUB1.

Figure 4:
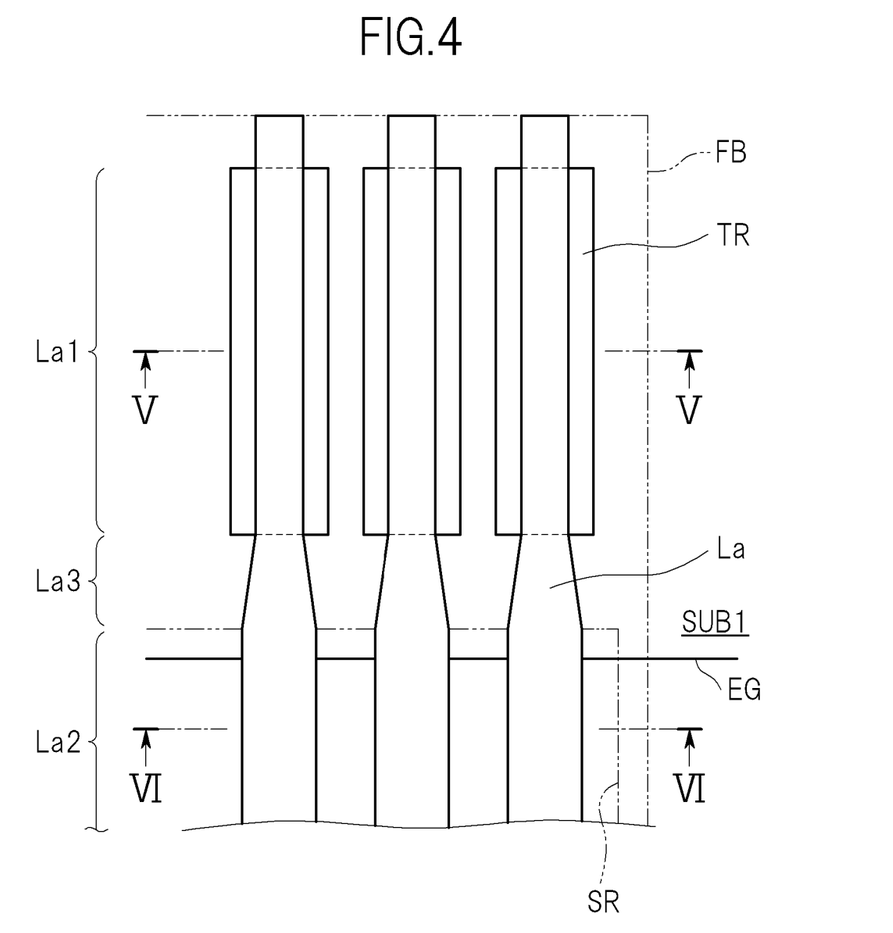
FIG. 4 is an enlarged view of a connection portion between the thin film transistor substrate and a flexible board according to the first embodiment.
Figure 5:
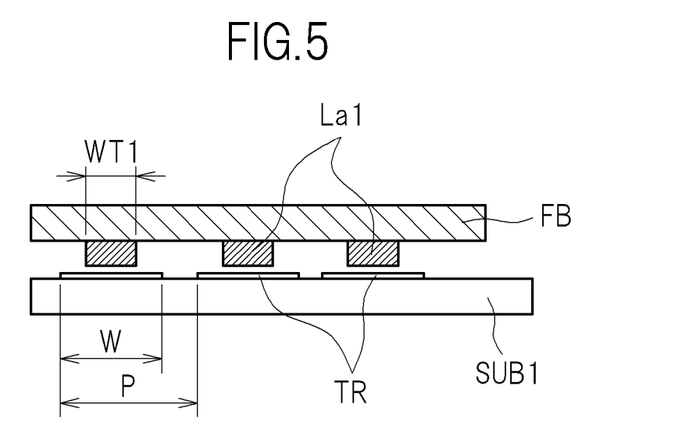
FIG. 5 is a view illustrating the V-V cross section of FIG. 4.
Figure 6:
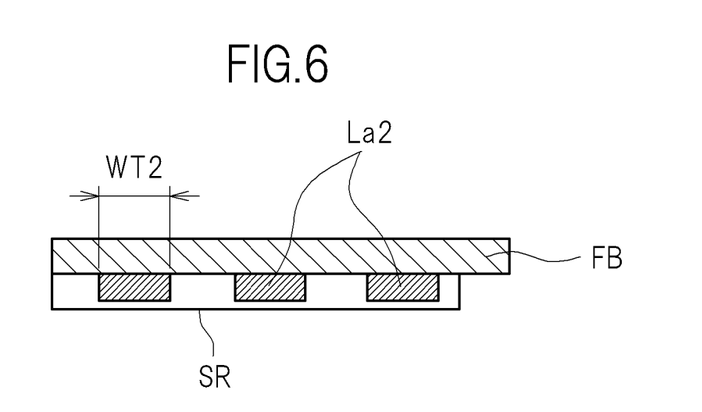
FIG. 6 is a view illustrating the VI-VI cross section of FIG. 4.

Here, FIGS. 4 to 6 illustrate an enlarged connection portion between the thin film transistor substrate SUB1 and the flexible board FB of this embodiment. FIG. 4 is an enlarged view illustrating a top surface of the connection portion. FIGS. 5 and 6 are views illustrating the V-V cross section and the VI-VI cross section of FIG. 4, respectively.

First, the thin film transistor substrate SUB1 includes a terminal portion including a plurality of terminals TR for making connection between the drain signal lines DL or the gate signal lines GL and the drive circuits. As illustrated in FIG. 4, each of the plurality of terminals TR according to this embodiment is formed on the thin film transistor substrate SUB1 into a rectangular shape. The terminals TR are arranged in parallel along an edge portion EG of the thin film transistor substrate SUB1 with a predetermined pitch P. The terminals TR are arranged so that the long sides thereof are substantially perpendicular to the edge portion EG. Further, the edge portion EG of the thin film transistor substrate SUB1 is an edge face (cutting edge) used when cut from the mother glass. Note that, the terminal portion of this embodiment refers to a portion defined by lines connecting the short sides of the plurality of terminals TR, and by the long sides of two terminals which are disposed on both ends of the plurality of terminals TR.

Next, as illustrated in FIG. 4 (or FIG. 1 etc.), the flexible board FB is fixed so as to overlap apart of the thin film transistor substrate SUB1. Further, in this embodiment, the flexible board FB completely covers each of the plurality of terminals TR from above, and is fixed with the anisotropic conductive film ACF (not shown in FIG. 4) interposed between the flexible board FB and the thin film transistor substrate SUB1. In addition, the terminals TR provided on the thin film transistor substrate SUB1 are set to have a smaller size than the dimension of a margin for bonding between the flexible board FB and the thin film transistor substrate SUB1.

Further, the flexible board FB is fixed onto the thin film transistor substrate SUB1 so that the plurality of wirings La of the flexible board FB may overlap the plurality of terminals TR, respectively. In this manner, the plurality of wirings La have such a layout that the wirings La are routed so as to extend linearly from the plurality of terminals TR, respectively, to intersect substantially perpendicularly with the edge portion EG of the thin film transistor substrate SUB1 (see FIG. 3A), then being connected to the semiconductor chip CP.

In particular, as understood from FIG. 4 and comparison between FIG. 5 and FIG. 6, the wirings La formed on the flexible board FB each have partially different widths. Specifically, the wirings La on the flexible board FB each include a first wiring portion La1, which overlaps the terminal TR, and a second wiring portion La2, which is positioned between the first wiring portion La1 and the semiconductor chip CP. The first wiring portion La1 has a first line width WT1 which is smaller than a second line width WT2 of the second wiring portion La2. In this manner, short-circuit between wirings less occurs with respect to the width of the terminals TR, and the mechanical strength of the wiring La is enhanced.

Further, each terminal TR is disposed at a distance from the edge portion EG of the thin film transistor substrate SUB1 on the inner side of the thin film transistor substrate SUB1 (display region AR side). In the edge portion EG, a stress is easily generated due to a curve of the flexible board FB or the like. However, because the first wiring portion La1 having a smaller line width is disposed at a distance from the edge portion EG, the first wiring portion La1 is less broken.

In addition, as illustrated in FIG. 4, a third wiring portion La3, in which the wiring width expands, is interposed between each terminal TR and the edge portion EG of the thin film transistor substrate SUB1. In other words, the third wiring portion La3 is a portion positioned between the first wiring portion La1 and the second wiring portion La2, and the third wiring portion La3 overlaps a region between the edge portion EG of the thin film transistor substrate SUB1 and the terminals TR and has a line width which gradually increases toward the second wiring portion La2 from WT1 to WT2. In this manner, the line width of the wiring gradually changes in the third wiring portion La3 so as to alleviate the influence of stress concentration or the like, and in addition, the third wiring portion La3 exists on the inner side of the thin film transistor substrate SUB1 at a distance from the edge portion EG so as to compensate for the mechanical strength of the third wiring portion La3, which has a line width equal to or smaller than that of the second wiring portion La2.

Further, in this embodiment, as illustrated in FIG. 4, the plurality of second wiring portions La2 and the plurality of third wiring portions La3 are laid out linearly with the same pitch as the pitch P of the terminal portion, and the second wiring portions La2 intersect perpendicularly with the edge portion EG. The second wiring portion La2 starts from the end position of the third wiring portion La3, and is covered and protected by a resin film SR from its own starting position. As illustrated in FIG. 4, it is desired that the second wiring portion La2 start at a position closer to the terminal TR than the edge portion EG and be laid out on the flexible board FB so as to include a position at which the flexible board FB overlaps the edge portion EG. In other words, it is desired that the distance between the second wiring portion La2 and the terminal TR be shorter than the distance between the edge portion EG and the terminal TR. In this manner, a higher mechanical strength is ensured in the edge portion EG, in which the flexible board FB frequently curves.

Figure 7A:
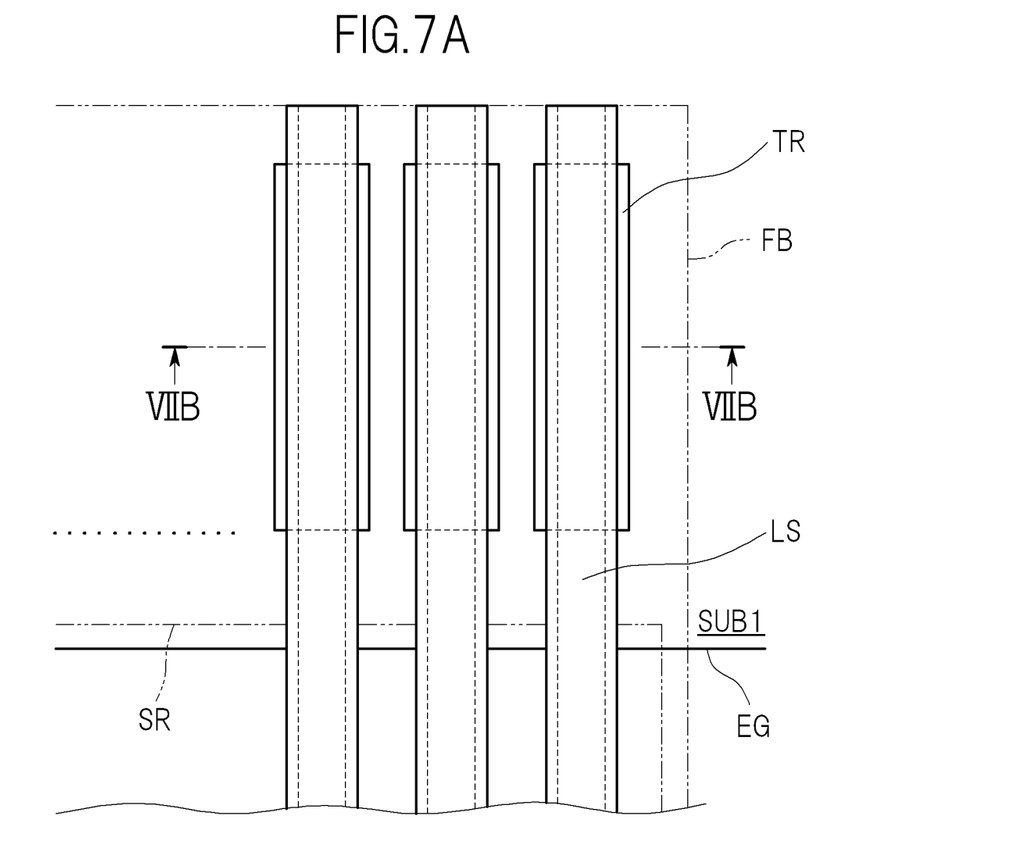
FIG. 7A is an enlarged view of a connection portion between a terminal portion of the thin film transistor substrate and the flexible board according to Reference Example 1.
Figure 7B:
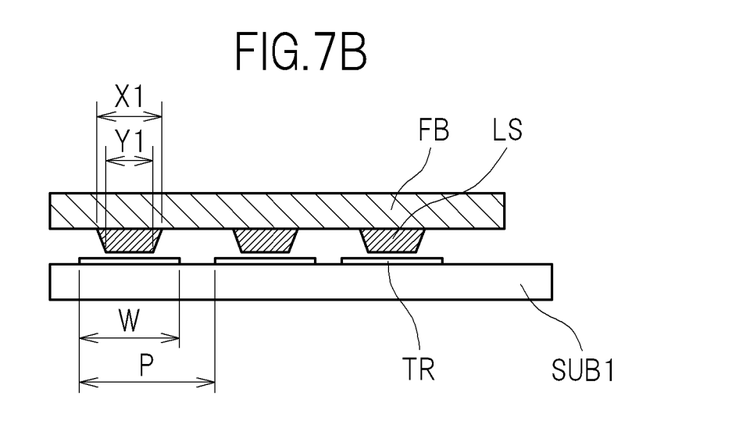
FIG. 7B is a view illustrating the VIIB-VIIB cross section of FIG. 7A.

Note that, FIGS. 7A and 7B are views illustrating Reference Example 1, in which FIG. 7A is an enlarged view of a connection region between the terminal portion of the thin film transistor substrate SUB1 and the COF. FIG. 7A is a top view illustrating a state in which wirings LS formed on the flexible board FB are connected in an overlapping manner to the terminals TR to be connected to the video signal lines of the thin film transistor substrate SUB1. The wirings LS allow electrical connection between the semiconductor chip mounted on the flexible board FB and the terminals TR. Note that, on the flexible board FB of the COF, the resin film SR (solder resist film) is formed as an insulating protective film by, for example, a solder resist.

FIG. 7B is a cross-sectional view taken along the line VIIB-VIIB of FIG. 7A. In FIG. 7B, the illustration of the anisotropic conductive film (ACF) provided between the terminal portion of the thin film transistor substrate SUB1 and the flexible board FB is omitted.

In Reference Example 1 illustrated in FIG. 7B, the wirings LS formed on the flexible board FB are each formed into a tapered shape by a manufacturing method using an etchant with isotropic solubility, so as to have a larger width on the flexible board FB side. Specifically, when the terminals TR are arranged with the equal pitch P, a width X1 of the wiring LS on the flexible board FB side is formed so as to be substantially p/2, whereas a width Y1 of the wiring LS on the terminal TR side is formed so as to be substantially p/3. Further, in Reference Example 1, a width W of each terminal TR of the thin film transistor substrate SUB1 is set to an optimal value in consideration of the tapered cross section of the wiring LS and the widths thereof.

Figure 8A:
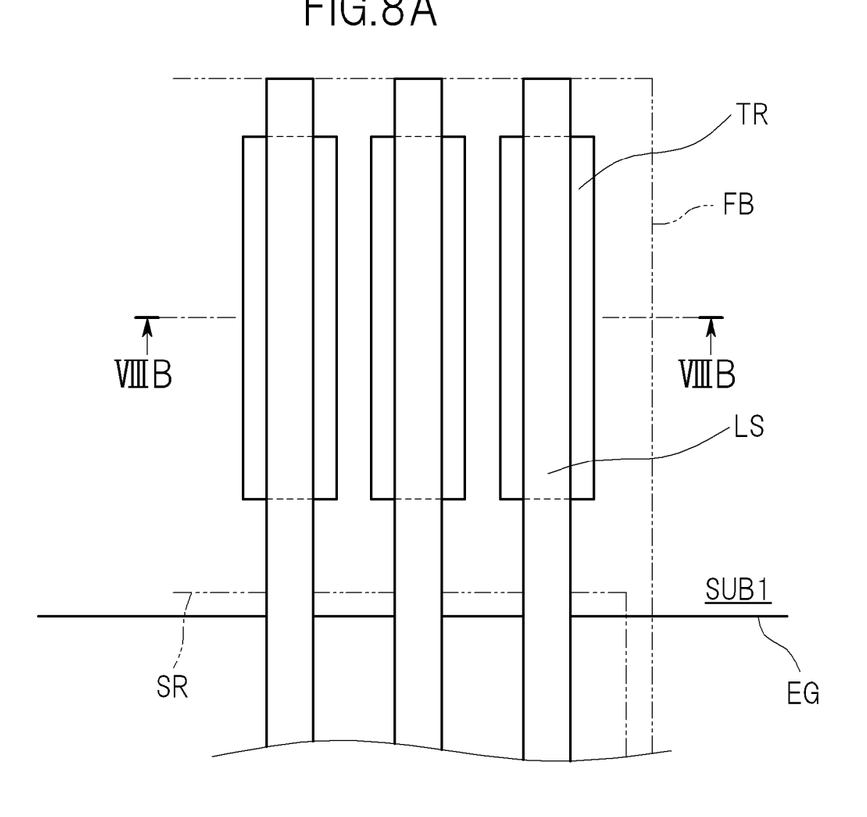
FIG. 8A is an example of an enlarged view of the connection portion between the terminal portion of the thin film transistor substrate and the flexible board according to Reference Example 2.
Figure 8B:
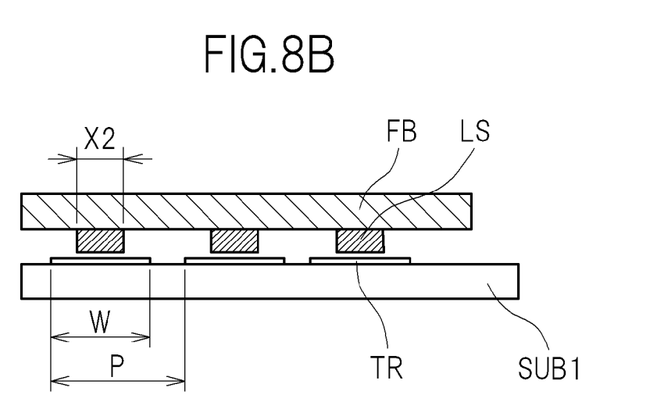
FIG. 8B is a view illustrating the VIIIB-VIIIB cross section of FIG. 8A.

Note that, FIGS. 8A and 8B are views illustrating Reference Example 2. Similarly to FIG. 7A, FIG. 8A is an enlarged view of the connection region between the terminal portion of the thin film transistor substrate SUB1 and the COF. FIG. 8B is a cross-sectional view taken along the line VIIIB-VIIIB of FIG. 8A. In Reference Example 2, the formation of wiring on the flexible board FB employs anisotropic etching and a lamination method, and the wirings are each formed into a rectangular cross section in which the widths of the bottom part and the top surface of the wiring are equal to each other, instead of being formed into the tapered cross section as illustrated in FIG. 7B.

In Reference Example 2, if a width X2 of the wiring LS is set to as small as about p/3, a margin is created in intervals between the wirings LS, and hence a failure such as short-circuit less occurs. However, the narrower width of the wiring LS results in a small sectional area of the wiring LS which is drawn out to the outside from the vicinity of the edge portion EG of the thin film transistor substrate SUB1. Therefore, the mechanical strength of the wiring LS is reduced to increase a fear of disconnection.

Further, in Reference Example 2, if the width X2 of the wiring LS is set to as large as about p/2, the mechanical strength is enhanced, but the width of a portion where the wiring LS overlaps the terminal TR is increased as well, with the result that a failure such as short-circuit is liable to occur.

Note that, in the first embodiment, as illustrated in FIG. 4, the first wiring portion La1 is disposed at the position overlapping the terminal TR, whereas the third wiring portion La3 is disposed at the position overlapping the thin film transistor substrate SUB1 rather than the terminal TR. However, it is supposed that the first wiring portion La1 or the like gets out of position because of an error when the flexible board FB is bonded to the terminal portion. In view of this, for example, the first wiring portion La1 may end before the short side of the terminal TR on the edge portion EG side, whereas the third wiring portion La3 may overlap the terminal TR as well as overlapping the region between the edge portion EG and the terminal TR so that the line width may start to expand from the position overlapping the terminal TR. Alternatively, the first wiring portion La1 may extend beyond the short side of the terminal TR on the edge portion EG side to be connected to the third wiring portion La3 so that the line width may start to expand from a position closer to the edge portion EG than the terminal TR. Further, for example, it is also possible to design a layout in which the first wiring portion La1 is fixed beyond the short side of the terminal TR on the edge portion EG side. It should be understood that this layout is also included in the scope of the present invention.

Note that, in the first embodiment, as illustrated in FIGS. 5 and 6, the wirings La are formed on the flexible board FB by using anisotropic etching and a lamination method so as to have a rectangular cross section. In the case where the cross section is a rectangle, it is desired that the first line width WT1 of the first wiring portion La1 be set to 0.3 times or more and 0.4 times or less of the pitch P, with which the terminals TR are arranged. Further, in this case, it is desired that the second line width WT2 of the second wiring portion La2 be set to 0.45 times or more and 0.55 times or less of the pitch P. The width of the terminal TR provided on the thin film transistor substrate SUB1 may be larger than the second line width WT2.

Note that, in this embodiment, the wirings La are each formed in the rectangular cross section, but it is not always necessary to form the cross section into a precise rectangle. The present invention can also be applicable to a case where the cross section is not formed into a rectangle.

Note that, in the above-mentioned embodiment, the drive circuit including the flexible board FB illustrated in FIG. 4 or the like may be either of the drain driver HC and the gate driver VC, and is applicable to both of the drain driver HC and the gate driver VC.

Note that, it is desired that the third wiring portion La3 have a linearly-changing width as described in the above-mentioned embodiment. Alternatively, however, the width may have a stepwise change with a plurality of steps.

Note that, in the above-mentioned embodiment, as illustrated in FIG. 4, three wirings La each include the first wiring portion La1 having the first line width WT1 and the second wiring portion La2 having the second line width WT2. For example, however, even if only one of the plurality of wirings La includes the first wiring portion La1 and the second wiring portion La2, the mechanical strength is ensured while suppressing an electrical failure because such a case is also included in the scope of the present invention.

Note that, the above-mentioned embodiment provides the description of a liquid crystal display device, but the present invention is also applicable to other display devices such as an organic EL display device. Further, the liquid crystal display device to which the present invention is applicable is not limited to the above-mentioned pixel configuration. For example, the present invention is applicable to a liquid crystal display device of a so-called lateral electric-field type, which has a pixel configuration in which a pixel electrode and a counter electrode are formed in a pixel region on the substrate SUB1 side, and liquid crystal is driven by an electric field generated between the electrodes. The present invention is also applicable to liquid crystal display devices having other types of pixel configuration.

While there have been described what are at present considered to be certain embodiments of the invention, it will be understood that various modifications may be made thereto, and it is intended that the appended claims coverall such modifications as fall within the true spirit and scope of the invention.

What is claimed is:

1. A display device, comprising:
a display panel which comprises a thin film transistor substrate on which a terminal portion including a plurality of terminals is provided, the plurality of terminals being disposed at a distance from an edge portion of the thin film transistor substrate on an inner side of the thin film transistor substrate; and
a drive circuit connected to the terminal portion, wherein:
the drive circuit comprises:
a flexible board; and
a semiconductor chip mounted on the flexible board;
the flexible board comprises a plurality of wirings for connecting the semiconductor chip and the plurality of terminals, respectively; and
the plurality of wirings each comprise:
a first wiring portion which overlaps a corresponding one of the plurality of terminals; and
a second wiring portion which is positioned between the first wiring portion and the semiconductor chip,
wherein the second wiring portion has a length greater than its width,
the first wiring portion is narrower than the second wiring portion,
the second wiring portion overlaps the edge portion of the thin film transistor substrate, overlaps a part of the region between the edge portion of the thin film transistor substrate and the terminals, but does not overlap the terminal portion.

2. A display device, comprising:
a display panel which comprises a thin film transistor substrate on which a terminal portion including a plurality of terminals is provided; and
a drive circuit connected to the terminal portion, wherein:
the drive circuit comprises:
a flexible board; and
a semiconductor chip mounted on the flexible board;
the flexible board comprises a plurality of wirings for connecting the semiconductor chip and the plurality of terminals, respectively; and
the plurality of wirings each comprise:
a first wiring portion which overlaps a corresponding one of the plurality of terminals; and
a second wiring portion which is positioned between the first wiring portion and the semiconductor chip,
wherein the second wiring portion has a length greater than its width,
the first wiring portion is narrower than the second wiring portion,
a part of the flexible board overlaps a part of the thin film transistor substrate including the terminal portion;
the plurality of wirings each further comprise a third wiring portion which is positioned between the first wiring portion and the second wiring portion; and
the third wiring portion overlaps a region between the edge portion of the thin film transistor substrate and the corresponding one of the plurality of terminals, and is gradually increased in line width as being closer to the second wiring portion.

3. The display device according to claim 1, wherein:
the plurality of terminals are arranged with a predetermined pitch;
the plurality of wirings are each formed into a rectangular cross section; and
the first wiring portion has a line width which is 0.3 times or more and 0.4 times or less of the predetermined pitch.

4. The display device according to claim 1, wherein:
the plurality of terminals are arranged along an edge portion of the thin film transistor substrate with a predetermined pitch; and
the plurality of wirings each intersect substantially perpendicularly with the edge portion of the thin film transistor substrate, and overlap the plurality of terminals, respectively.

5. The display device according to claim 1, wherein:
the second wiring portion extends from the semiconductor chip towards the first wiring portion.

6. A display device, comprising:
a display panel which comprises a thin film transistor substrate on which a terminal portion including a plurality of terminals is provided; and
a drive circuit connected to the terminal portion, wherein:
the drive circuit comprises:
a flexible board; and
a semiconductor chip mounted on the flexible board;
the flexible board comprises a plurality of wirings for connecting the semiconductor chip and the plurality of terminals, respectively; and
the plurality of wirings each comprise:
a first wiring portion which overlaps a corresponding one of the plurality of terminals; and
a second wiring portion which is positioned between the first wiring portion and the semiconductor chip; and
a third wiring portion which is positioned between the first wiring portion and the second wiring portion,
wherein the third wiring portion overlaps a region between an edge portion of the thin film transistor substrate and the corresponding one of the plurality of terminals, and is gradually increased in line width as being closer to the second wiring portion.

7. The display device according to claim 6, wherein:
the second wiring portion extends from the semiconductor chip to the third wiring portion.

8. The display device according to claim 1, wherein the plurality of wirings each further comprise a third wiring portion which is positioned between the first wiring portion and the second wiring portion; and the third wiring portion overlaps a portion of the region between the edge portion of the thin film transistor substrate and the corresponding one of the plurality of terminals.

* * * * *